United States Patent [19]

Doyle et al.

[11] Patent Number: 4,835,487

[45] Date of Patent: May 30, 1989

[54] MOS VOLTAGE TO CURRENT CONVERTER

[75] Inventors: James T. Doyle; Bart R. McDaniel, both of Phoenix, Ariz.

[73] Assignee: Motorola, Inc., Schaumburg, Ill.

[21] Appl. No.: 181,607

[22] Filed: Apr. 14, 1988

[51] Int. Cl.[4] .......................... H03F 3/16; G05F 1/56
[52] U.S. Cl. .................................... 330/277; 323/315; 330/288
[58] Field of Search ...................... 330/257, 277, 288; 323/315, 316

[56] References Cited

U.S. PATENT DOCUMENTS

| | | | |
|---|---|---|---|
| 4,019,121 | 4/1977 | Feindt | 323/315 |
| 4,325,019 | 4/1982 | Tezuka | 323/315 |
| 4,612,496 | 9/1986 | Hines | 323/315 |
| 4,618,816 | 10/1986 | Monticelli | 323/316 |
| 4,700,144 | 10/1987 | Thomson | 330/257 |
| 4,717,869 | 1/1988 | Koch et al. | 323/316 |

Primary Examiner—James B. Mullins
Attorney, Agent, or Firm—Michael D. Bingham

[57] ABSTRACT

A voltage to current converter circuit manufactured with a MOS process generates a linear reference current over a wide bandwidth and operates with an input signal that varies to either supply rail. A voltage divider network scales an input voltage for conversion to a linear current by a cascode current mirror and a gain resistor. The value of the gain resistor determines the transconductance of the conversion from voltage to current. A second current mirror provides feedback to keep the reference current accurate. An output stage makes available high impedance source and sink current output terminals wherein a source current and a sink current relative to the reference current are provided. Several voltage to current converter circuits may be coupled together to provide a addition, subtraction, multiplication, and other circuit and system functions.

16 Claims, 3 Drawing Sheets

MOS VOLTAGE TO CURRENT CONVERTER

FIELD OF THE INVENTION

This invention relates in general to transconductance amplifier circuits and, more particularly, to a metal oxide semiconductor (MOS) voltage to current converter circuit providing a reference current, the magnitude of the reference current varying linearly with an input voltage that may vary to the supply voltage rails, having a single ended input stable over a wide bandwidth without requiring compensation, offset correction, external feedback, or capacitive coupling of the input voltages

BACKGROUND OF THE INVENTION

Operational amplifiers have been widely used in the electronics industry for their many excellent circuit characteristics including high open loop gain, high input impedance, and low output impedance. General applications of the operational amplifier include circuit configurations such as voltage and current amplifiers, differentiators and integrators, comparators, active filters, oscillators, and analog to digital and digital to analog converters. Operational amplifiers may be further used to convert a voltage to a current (transconductance amplifiers) by inputting a voltage to be converted into the noninverting input of the operational amplifier, and having the output drive a Darlington transistor pair which supplies the desired output current. One drawback of the operational amplifier is a necessary trade-off between speed and accuracy. Higher speed is obtained by reducing the DC precision; likewise, a low DC error is achieved at the expense of a reduced bandwidth. Further, the operational amplifier requires differential inputs, compensation, offset correction, external feedback, and a significant amount of silicon area in its implementation.

A more recent circuit development, the operational transconductance amplifier (OTA), has emerged which improves upon some of the operational amplifier characteristics. The OTA, like the operational amplifier, can be used in a wide variety of circuit and system applications. The OTA, however, offers higher performance and its performance is independent of load conditions. A major advantage of the OTA lies in the ability to couple the outputs of several OTAs together in order to sum, subtract, or multiply the voltages at the inputs of the individual OTAs. Because the outputs of the OTAs are currents, coupling additional outputs do not degrade performance. Also, because inputs are isolated, increasing the number of inputs does not degrade performance Like the operational amplifier, however, OTAs require differential inputs and external feedback, a significant amount of silicon area, and are not able to operate linearly with an input voltage which goes all the way to the $V_{SS}$ or $V_{DD}$ supply rail. It is desirable to negate the need for external feedback and reduce the number of terminals required by using a single ended input versus the differential inputs required by the operational amplifier and the OTA.

Thus, what is needed is a voltage to current converter providing a reference current, the magnitude of the reference current varying linearly with an input voltage that may vary to the supply voltage rails, having a single ended input stable over a wide bandwidth without requiring compensation, offset correction, external feedback, or capacitive coupling of the input voltages.

SUMMARY OF THE INVENTION

Accordingly, an object of the present invention is to provide an improved voltage to current converter.

Another object of the present invention is to provide an improved voltage to current converter providing linear operation for an input voltage that may vary to the supply voltage rails.

A further object of the present invention is to provide a voltage to current converter with closed loop gain and a single ended input.

Yet a further object of the present invention is to provide a voltage to current converter with improved bandwidth and DC precision without requiring external feedback, compensation, or offset correction.

In carrying out the above and other objects of the invention in one form, there is provided a MOS voltage to current converter having a voltage divider network coupled to one of a first or second supply voltage terminals and coupled to a third supply voltage terminal. The voltage divider network has as its output a reference voltage that is some ratio of a conversion voltage at the third supply voltage terminal with respect to the first or second supply voltage terminal. The output of the voltage divider network is coupled to a linear reference current generator circuit having a high input impedance. The linear reference current generator circuit provides a current that varies linearly with respect to the reference voltage. Positive feedback is used in the linear reference current generator circuit in order to compensate itself for changes in the current from the nominal value thus eliminating the need for external feedback. An output circuit is coupled to the first, second, and third supply voltage terminals and coupled to the linear reference current generator circuit. The output circuit provides high impedance output current sink and output current source terminals to provide an output sink current and an output source current respectively which is based on the linear reference current generated in the linear reference current generator circuit.

The above and other objects, features, and advantages of the present invention will be better understood from the following detailed description taken in conjunction with the accompanying drawings.

DETAILED DESCRIPTION OF THE INVENTION

Figure 1:
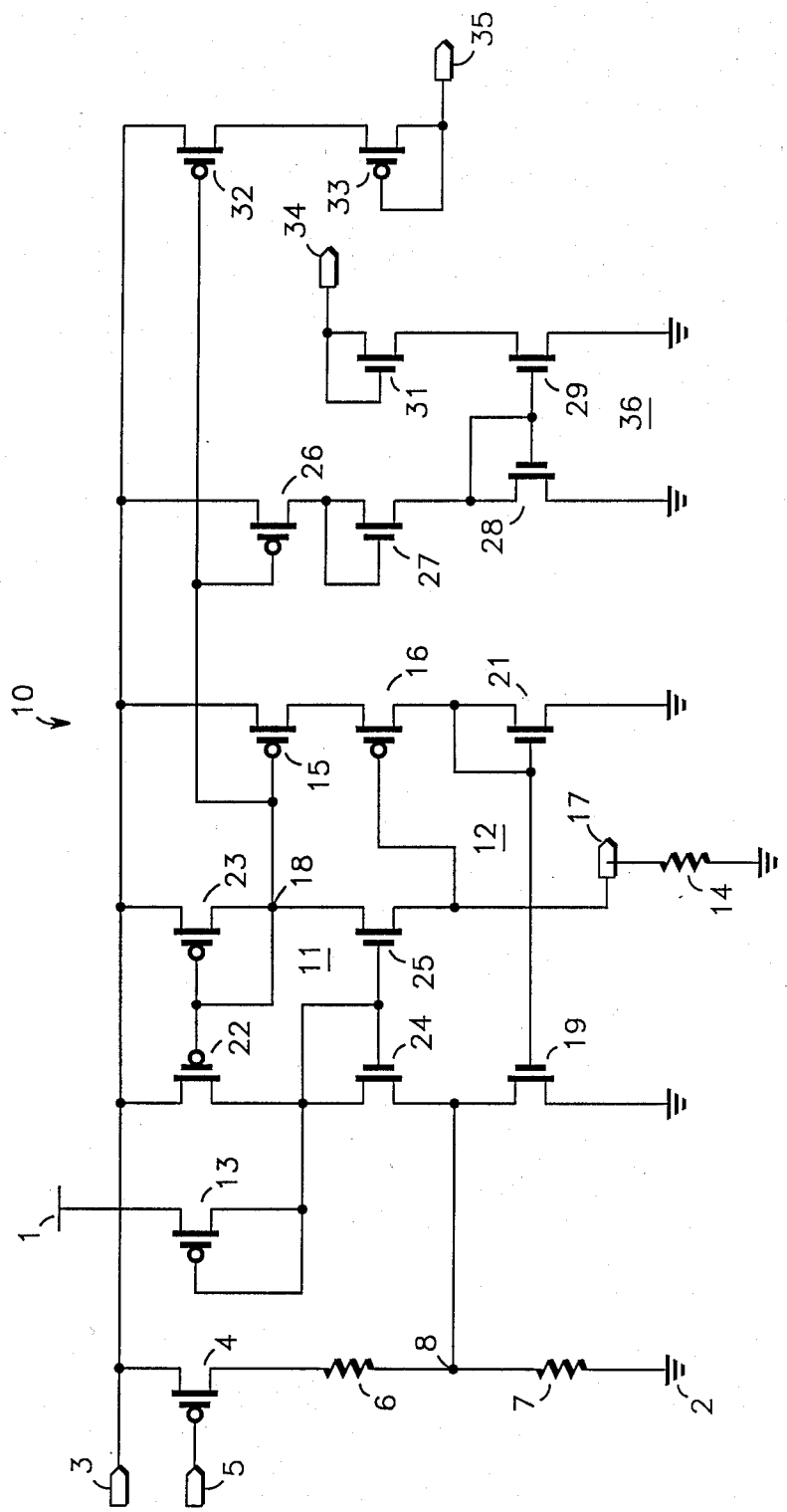
FIG. 1 is a schematic of a first embodiment of the present invention.

FIG. 1 illustrates a voltage to current converter circuit 10 that is manufacturable using a standard MOS process. A field effect transistor 4 has a source connected to a supply voltage terminal 3, a gate connected to an enable terminal 5, and a drain coupled to a voltage reference node 8 by a resistor 6, and the voltage reference node 8 is coupled to a supply voltage terminal 2 by a resistor 7. The field effect transistor 4 and the resistors 6 and 7 comprise a voltage divider for providing a reference voltage ($V_{REF}$) at the voltage reference node 8 with its magnitude determined by a conversion voltage ($V_{CONV}$) at the supply voltage terminal 3 and the ratio of the resistances of the resistors 6 and 7.

It is typical for the value of a resistor to vary by as much as 20 percent in a MOS process due to process and temperature variations A change in the value of the resistor 6 ($R_6$) can be offset by a corresponding change in the value of the resistor 7 ($R_7$) and vise versa if the two resistors 6 and 7 are placed in close proximity to one another. A stable reference voltage then, can be developed at the voltage reference node 8 by the use of monolithically integrated resistors. The reference voltage in this arrangement is determined by the relationship:

$$V_{REF} = V_{CONV}(R_7/(R_7+R_6)).$$

Other methods to provide the reference voltage could include using ratioed field effect transistors or by the use of switched capacitor circuits. The voltage to current converter circuit can be put into a low power stand-by mode by applying a logical 1 signal at the enable terminal 5, whereby field effect transistor 4 will be in its nonconducting state and no current will flow through the resistors 6 and 7 and thus the reference voltage will equal 0.0 volts.

The linear reference current generator circuitry is comprised of a cascode current mirror 11, a current mirror 12, and devices 13, 14, 15, and 16. The cascode current mirror 11 comprises field effect transistors 2, 23, 24, and 25, and the current mirror 12 comprises field effect transistors 19 and 21. In the cascode current mirror 11, field effect transistor 23 forms a diode having a source connected to the supply voltage terminal 3, and a gate and a drain connected to a current reference node 18. The field effect transistor 22 having a source connected to the supply voltage terminal 3, a gate connected to the current reference node 18, and a drain connected to the source of a field effect transistor 24, mirrors a linear reference current that is produced in the field effect transistor 23. The field effect transistor 24 forms a diode having a gate connected to a source, and a drain connected to the voltage reference node 8. The field effect transistor 25 having a drain connected to the current reference node 18, a gate connected to the gate of the field effect transistor 24, and a source connected to a gain terminal 17, mirrors the mirrored linear reference current flowing in the field effect transistor 24.

In current mirror 12, the field effect transistor 21 forms a diode having a source connected to the supply voltage terminal 2, and a gate and a drain connected to a gate of a field effect transistor 19. The field effect transistor 19 having a source connected to the supply voltage terminal 2, and a drain connected to the voltage reference node 8, mirrors a feedback current flowing in the field effect transistor 21. A gain resistor 14 ($R_{14}$) is coupled between the gain terminal 17 and the supply voltage terminal 2 and sets the magnitude of the linear reference current flowing in the cascode current mirror 11. The gain resistor 14 could be implemented as a monolithically integrated resistor on chip, or as a field effect transistor operated in its linear region. Alternatively, an external resistor (not monolithically integrated) could be used as the gain resistor 14 (providing excellent accuracy therewith).

The field effect transistor 15 has a source connected to the supply voltage terminal 3, a gate connected to the current reference node 18, and a drain connected to the source of a field effect transistor 16. The field effect transistor 16 has a gate connected to the gain terminal 17, and a drain connected to the drain of the field effect transistor 21. The field effect transistor 13 has a source connected to a supply voltage terminal 1, and a gate and a drain connected to the source of the field effect transistor 24 for providing a start-up current to the cascode current mirror 11 when power is initially applied to the supply voltage terminals 1, 2, and 3.

An output stage comprises a current mirror 36, wherein a field effect transistor 28 forms a diode having a source connected to the supply voltage terminal 2, and a gate and a drain connected to the drain of a field effect transistor 27. A field effect transistor 29 has a source connected to the supply voltage terminal 2, a gate connected to the gate of the field effect transistor 28, and a drain connected to the source of a field effect transistor 31 for mirroring a reference sink current flowing in the field effect transistor 28. A field effect transistor 26 having a source connected to the supply voltage terminal 3, a gate connected to the current reference node 18, and a drain connected to a gate and a source of the field effect transistor 27, sources the reference sink current to the current mirror 36. The field effect transistor 27 increases the impedance between the field effect transistor 26 and the supply voltage terminal 2.

A field effect transistor 32 has a source connected to the third supply voltage terminal 3, a gate connected to the current reference node 18, and a drain connected to the source of a field effect transistor 33 for providing a reference source current. The field effect transistor 31 has a gate and a drain connected to an output current sink terminal 34, and the field effect transistor 33 has a gate and drain connected to an output current source terminal 35. The purpose of the field effect transistors 31 and 33 is for increasing the output impedances at the output current sink and output current source terminals 34 and 35, respectively, therein providing the capability to couple the outputs of several voltage to current converter circuits together without degrading performance substantially.

The reference voltage, as noted earlier, is determined by the ratio of the resistances of the resistors 6 and 7. A typical value of the reference voltage could be set at ¼ the value of the conversion voltage. To accomplish this would require the resistance of $R_6$ to be three times the resistance of $R_7$. In order to ensure the parallel impedance of the field effect transistors 19 and 24 do not substantially affect the reference voltage, the values of the resistors 6 and 7 should be chosen such that their parallel resistance is approximately 1/10 of the parallel impedance of the field effect transistors 19 and 24.

By the action of the cascode current mirror 11, the reference voltage will be precisely tracked by a gain voltage at the gain terminal 17. A change in the conversion voltage causes a proportional change in the reference voltage which is accurately tracked at the gain terminal 17. The change in the gain voltage is accomplished by a linear change in the linear reference current through the cascode current mirror 11 since this current change is determined by the reference voltage. By way of example only, a transconductance of 1 microamp/1 volt can be obtained by satisfying the following relationships:

set $R_6 = 3R_7$, as a result $V_{REF} = V_{CONV}/4$
$I_{R14} = V_{CONV}/(4R_{14})$ $$R_{14} = V_{CONV}/(4I_{R14}) = 1 \text{ volt}/4 \text{ microamps}$$

$$R_{14} = 250{,}000 \text{ ohms}.$$

As a result, a change in the conversion voltage of 1 volt corresponds to a change in the linear reference current of 1 microamp. A different transconductance may be produced by varying the relationship of $R_6$ to $R_7$ and by varying the value of $R_{14}$.

The linear reference current flowing in the gain resistor 14 is reflected to the field effect transistor 15 by the current reference node 18. An undesired fluctuation in the linear reference current is mirrored back to the cascode current mirror 11 by the action of the current mirror 12. This fluctuation in the linear reference current flows through transistor 19 instead of being dissipated in the voltage divider network which would cause an unwanted change in the reference voltage. The closed loop operation of the linear reference current generator circuit keeps the reference voltage very precise. Typically the conversion voltage would be applied to the gates of several field effect transistors, but by using the sources of transistors 15, 22, 23, 26, and 32 as the controlling nodes, it is possible to increase the usable operating range of the conversion voltage. Operation of the MOS voltage to current converter circuit 10 will extend from the sum of a N-channel and a P-channel field effect transistor threshold voltage to a base-emitter voltage ($V_{BE}$) above the $V_{DD}$ supply voltage at the supply voltage terminal 1.

The linear reference current is reflected to the output stage's field effect transistors 26 and 3 by current reference node 18. The reference sink current flowing in the field effect transistor 26 will be mirrored in the field effect transistor 29 by the current mirror 36 when a load is connected to the output current sink terminal 34. The output current sink terminal 34 then, will sink an output sink current equal to the linear reference current or some ratio thereof. Likewise, when a load is connected to the output current source terminal 35, an output source current equal to the linear reference current or some ratio thereof will be sourced to the load.

Figure 2:
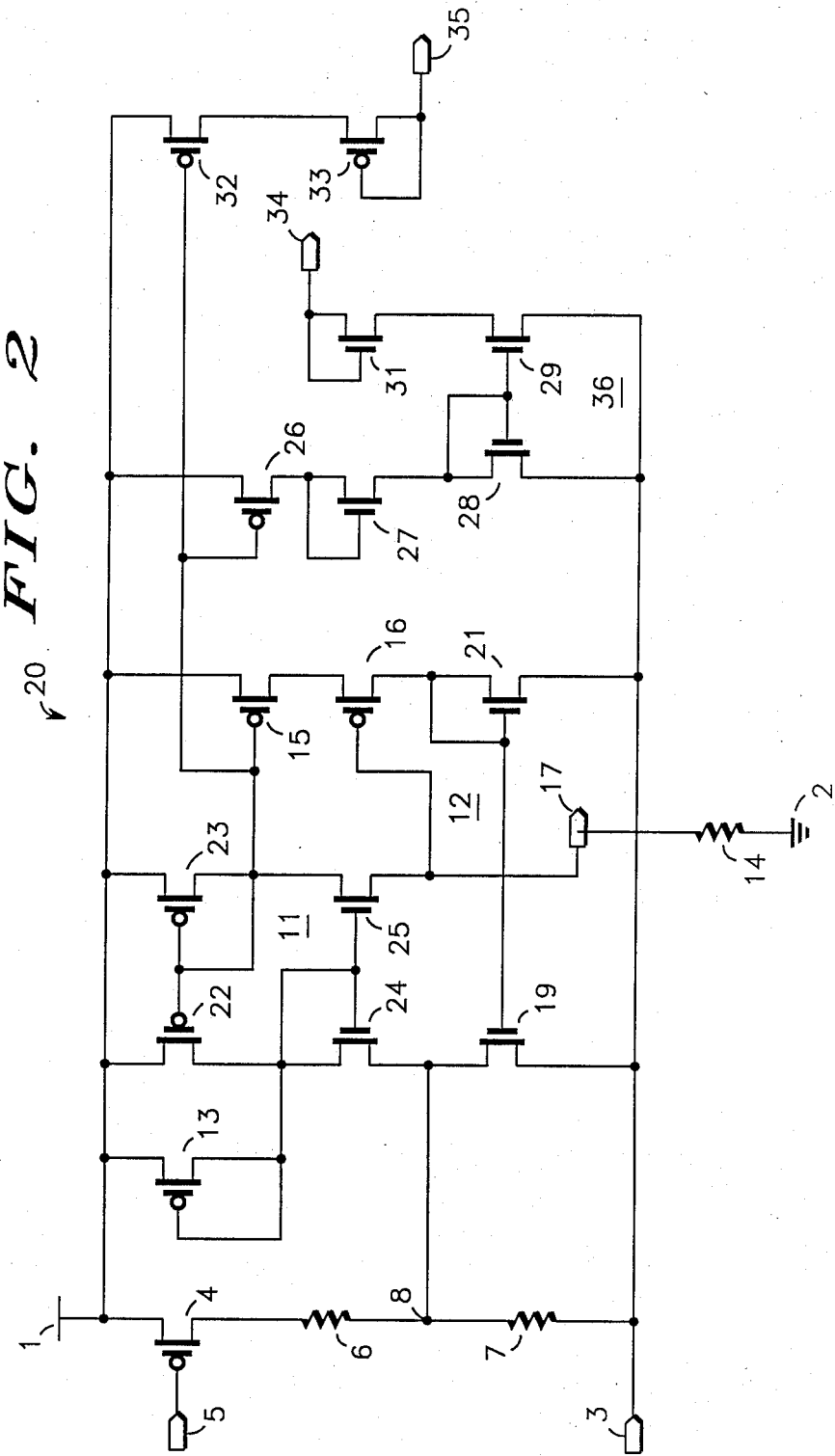
FIG. 2 is a schematic of a second embodiment of the prevent invention.

The first and second embodiments of the present invention are comprised of similar devices, but the second embodiment operates with the supply voltage terminals, 1, 2, and 3 connected in a different manner as illustrated in FIG. 2. The difference in the second embodiment includes the sources of field effect transistors 4, 15, 22, 23, 26, and 32 being connected to the supply voltage terminal 1, the sources of field effect transistors 19, 21, 28, and 29 being connected to the supply voltage terminal 3, and the resistor 7 is coupled between the voltage reference node 8 and the supply voltage terminal 3. Also, the resistor 6 is coupled between the supply voltage terminal 1 and the voltage reference node 8.

The reference voltage in the second embodiment will be determined by the ratios of resistances of the resistors 6 and 7, and by the magnitude of the conversion voltage with respect to the $V_{DD}$ supply voltage and is calculated by:

$$V_{REF} = (V_{DD} - V_{CONV})R_7/(R_7 + R_6).$$

In this configuration, the MOS voltage to current converter circuit 20 provides a linear reference current for a conversion voltage that may vary from the $V_{SS}$ supply voltage less a $V_{BE}$ to the $V_{DD}$ supply voltage less the sum of a N-channel and a P-channel threshold voltage.

Figure 3:
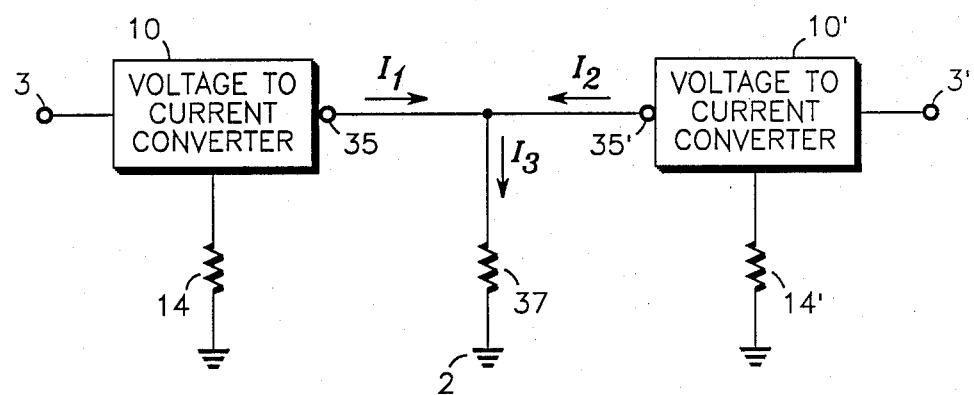
FIG 3 is a partial block diagram of an adder circuit comprising the first embodiment.

An example of an adder implementation using the MOS voltage to current converter circuit 10 is shown in FIG. 3. In this example, two voltage to current converter circuits 10 and 10', are used to add two conversion voltages, $V_{CONV1}$ and $V_{CONV2}$, applied at the supply voltage terminals 3 and 3' respectively. Each MOS voltage to current converter circuit 10 and 10' may have a different gain as set by the gain resistors 14 and 14' respectively An output current source terminal 35 and 35' of each MOS voltage to current converter circuit 10 and 10' is coupled to the supply voltage terminal 2 by a load resistor 37. An output source current, $I_1$, flowing from the output current source terminal 35 is added to an output source current, $I_2$, flowing from the output current source terminal 35', and the sum of these currents, $I_3$, flows through the load resistor 37.

The conversion voltages, $V_{CONV1}$ and $V_{CONV2}$ may vary from the sum of an N-channel and a P-channel threshold voltage above the $V_{SS}$ supply voltage to a $V_{BE}$ above the $V_{DD}$ supply voltage. The voltage to current converter circuits 10 and 10' in FIG. 3 may be replaced by voltage to current converter circuits 20 and 20' to provide operation wherein the conversion voltages $V_{CONV1}$ and $V_{CONV2}$ may vary from the sum of an N-channel and a P-channel threshold voltage below the $V_{DD}$ supply voltage to a $V_{BE}$ below the $V_{SS}$ supply voltage. A subtractor circuit can be implemented by replacing the output current source terminal 35 connection of the voltage to current convert circuit 10 in FIG. 3 with a connection to the output current sink terminal 34. As a result, $I_1$ will be subtracted from $I_2$.

In this adder example, unlike the operational amplifier or OTA, it is possible to add signals that have different DC voltage levels without having to capacitively couple these signals to the input since each input is independent. Capacitively coupling the inputs is undesireable because the capacitors form an unwanted low pass filter and thus block the low frequency components of an input signal. Adding more than two signals could be accomplished by using more MOS voltage to current converter circuits and coupling the output current source terminals together. Also the adder circuit example does not require external feedback or compensation And because the inputs are single ended, offset correction is not a requirement. The MOS voltage to current converter circuit has been illustrated as an adder circuit, as an example, but may also be used to perform many other functions including multiplication, subtraction, etc.

By now it should be appreciated that there has been provided a MOS voltage to current converter circuit which provides a linear reference current accurate to the supply voltage rails, having a single ended input stable over a wide bandwidth without the need for compensation, offset correction, external feedback, or capacitive coupling.

We claim:
1. A MOS circuit comprising:
    a first supply voltage terminal for receiving a first supply voltage;
    a second supply voltage terminal for receiving a second supply voltage;
    a third supply voltage terminal for receiving a conversion voltage;
    an output current sink terminal;
    an output current source terminal;
    voltage divider means coupled between said second and third supply voltage terminals, wherein the conversion voltage provides power for said circuit and may vary over a range extending from two thresholds voltage above the second supply voltage to a $V_{be}$ above the first supply voltage, said voltage divider means having a voltage reference node for providing a reference voltage relative to the conversion voltage;

linear reference current generator means coupled to said first, second, and third supply voltage terminals, and coupled to said voltage reference node for providing a linear reference current whose magnitude varies linearly in response to a corresponding change in the conversion voltage; and output means coupled between said second and third supply voltage terminals and coupled to said linear reference current generator means for providing an output sink current and an output source current at said output current sink terminal and output current source terminal, respectively, wherein the magnitude of the output sink current and the magnitude of the output source current are a ratio of the magnitude of the linear reference current.

2. A circuit according to claim 1 wherein said voltage divider means comprises:

a first resistor coupled between said third supply voltage terminal and the voltage reference node; and a second resistor coupled between the voltage reference node and said second supply voltage terminal.

3. A circuit according to claim 1 wherein said linear reference current generator means comprises:

a gain terminal;

a gain resistor coupled between said gain terminal and said second supply voltage terminal;

a first current mirror means coupled between said third supply voltage terminal and said gain terminal and coupled to the voltage reference node for generating the linear reference current wherein the value of said gain resistor in conjunction with the magnitude of the conversion voltage determines the magnitude of the linear reference current flowing in said first current mirror means;

a second current mirror means coupled to said second supply voltage terminal and the voltage reference node for providing a feedback current to said first current mirror means;

a first field effect transistor having a source coupled to said first supply voltage terminal and a gate and a drain coupled to said first current mirror means;

a second field effect transistor having a gate coupled to said first current mirror means, a source coupled to said third supply voltage terminal, and having a drain; and a third field effect transistor having a source coupled to the drain of said second field effect transistor, a gate coupled to said gain terminal, and a drain coupled to said second current mirror means.

4. A circuit according to claim 3 wherein said output means comprises:

a third current mirror means coupled between said second supply voltage terminal and said output current sink terminal for sinking a current from said output current sink terminal;

a fourth field effect transistor having a source coupled to said third supply voltage terminal, a gate coupled to said linear reference current generator means, and having a drain;

a fifth field effect transistor having a source and a gate coupled to the drain of said fourth field effect transistor and a drain coupled to said third current mirror means; and a sixth field effect transistor having a source coupled to said third supply voltage terminal, a gate coupled to the gate of said fourth field effect transistor, and a drain coupled to said output current source terminal.

5. A circuit according to claim 4 wherein said first current mirror means comprises:

a seventh field effect transistor having a source coupled to said third supply voltage terminal, a gate coupled to the gate of said second field effect transistor, and a drain coupled to the gate and the drain of said first field effect transistor;

an eighth field effect transistor having a source coupled to said third supply voltage terminal, and a gate and a drain coupled to the gate of said second field effect transistor;

a ninth field effect transistor having a gate and a source coupled to the drain of said seventh field effect transistor, and a drain coupled to the voltage reference node; and a tenth field effect transistor having a drain coupled to the gate of said second field effect transistor, a gate coupled to the gate of said ninth field effect transistor, and a source coupled to said gain terminal.

6. A circuit according to claim 5 wherein said second current mirror means comprises:

an eleventh field effect transistor having a gate and a drain coupled to the drain of said third field effect transistor, and a source coupled to said second supply voltage terminal; and a twelfth field effect transistor having a drain coupled to the voltage reference node, a gate coupled to the gate of said eleventh field effect transistor, and a source coupled to said second supply voltage terminal.

7. A circuit according to claim 6 wherein said third current mirror means comprises:

a thirteenth field effect transistor having a gate and a drain coupled to the drain of said fifth field effect transistor, and a source coupled to said second supply voltage terminal; and a fourteenth field effect transistor having a drain coupled to said output current sink terminal, a gate coupled to the gate of said thirteenth field effect transistor, and a source coupled to said second supply voltage terminal.

8. A circuit comprising:

a first supply voltage terminal;

a second supply voltage terminal;

a third supply voltage terminal;

an output current sink terminal;

an output current source terminal;

a gain terminal;

a first resistor coupled between said third supply voltage terminal and a voltage reference node;

a second resistor coupled between the voltage reference node and said second supply voltage terminal;

a first field effect transistor having a source coupled to said first supply voltage terminal, and having a gate and a drain;

a second field effect transistor having a source coupled to said third supply voltage terminal, a gate coupled to a current reference node, and having a drain;

a third field effect transistor having a source coupled to the drain of said second field effect transistor, a gate coupled to said gain terminal, and having a drain;

a fourth field effect transistor having a source coupled to said third supply voltage terminal, a gate coupled to the current reference node, and having a drain;

a fifth field effect transistor having a source and a gate coupled to the drain of said fourth field effect transistor, and having a drain;

a sixth field effect transistor having a source coupled to said third supply voltage terminal, a gate coupled to the current reference node, and a drain coupled to said output current source terminal;

a seventh field effect transistor having a source coupled to said third supply voltage terminal, a gate coupled to the current reference node, and a drain coupled to the gate and the drain of said first field effect transistor;

an eighth field effect transistor having a source coupled to said third supply voltage terminal, and a gate and a drain coupled to the current reference node;

a ninth field effect transistor having a source and a gate coupled to the drain of said seventh field effect transistor, and a drain coupled to the voltage reference node;

a tenth field effect transistor having a drain coupled to the current reference node, a gate coupled to the gate of said ninth field effect transistor, and a source coupled to said gain terminal;

a gain resistor coupled between said gain terminal and said second supply voltage terminal;

an eleventh field effect transistor having a gate and a drain coupled to the drain of said third field effect transistor, and a source coupled to said second supply voltage terminal;

a twelfth field effect transistor having a drain coupled to the voltage reference node, a gate coupled to the gate of said eleventh field effect transistor, and a source coupled to said second supply voltage terminal;

a thirteenth field effect transistor having a gate and a drain coupled to the drain of said fifth field effect transistor, and a source coupled to said second supply voltage terminal; and a fourteenth field effect transistor having a drain coupled to said output current sink terminal, a gate coupled to the gate of said thirteenth field effect transistor, and a source coupled to said second supply voltage terminal.

9. A MOS circuit comprising:

a first supply voltage terminal for receiving a first supply voltage;

a second supply voltage terminal for receiving a second supply voltage;

a third supply voltage terminal for receiving a conversion voltage;

an output current sink terminal;

an output current source terminal;

voltage divider means coupled between said first and third supply voltage terminals, wherein the conversion voltage provides power for said circuit and may vary over a range extending from two threshold voltages below the first supply voltage to a $V_{be}$ below the second supply voltage, said voltage divider means having a voltage reference node for providing a reference voltage relative to a conversion voltage;

linear reference current generator means coupled to said first, second, and third supply voltage terminals, and coupled to said voltage reference node for providing a linear reference current whose magnitude varies linearly in response to a corresponding change in the conversion voltage; and output means coupled between said first and third supply voltage terminals and coupled to said linear reference current generator means for providing an output sink current and an output source current at said output current sink terminal and said output current source terminal, respectively, wherein the magnitude of the output sink current and the magnitude of the output source current are a ratio of the magnitude of the linear reference current.

10. A circuit according to claim 9 wherein said voltage divider means comprises:

a first resistor coupled between said first supply voltage terminal and the voltage reference node; and a second resistor coupled between the voltage reference node and said third supply voltage terminal 11. A circuit according to claim 9 wherein said linear reference current generator means comprises:

a gain terminal;

a gain resistor coupled between said gain terminal and said second supply voltage terminal;

a first current mirror means coupled between said first supply voltage terminal and said gain terminal and coupled to the voltage reference node for generating the linear reference current wherein the value of said gain resistor in conjunction with the magnitude of the conversion voltage determines the magnitude of the linear reference current flowing in said first current mirror means;

a second current mirror means coupled to said third supply voltage terminal and the voltage reference node for providing a feedback current to said first current mirror means;

a first field effect transistor having a source coupled to said first supply voltage terminal and a gate and a drain coupled to said first current mirror means;

a second field effect transistor having a gate coupled to said first current mirror means, a source coupled to said first supply voltage terminal, and having a drain; and a third field effect transistor having a source coupled to the drain of said second field effect transistor, a gate coupled to said gain terminal, and a drain coupled to said second current mirror means.

12. A circuit according to claim 11 wherein said output means comprises:

a third current mirror means coupled between said third supply voltage terminal and said output current sink terminal for sinking a current from said output current sink terminal;

a fourth field effect transistor having a source coupled to said first supply voltage terminal, a gate coupled to said linear reference current generator means, and having a drain;

a fifth field effect transistor having a source and a gate coupled to the drain of said fourth field effect transistor and a drain coupled to said third current mirror means; and a sixth field effect transistor having a source coupled to said first supply voltage terminal, a gate coupled to the gate of said fourth field effect transistor, and a drain coupled to said output current source terminal.

13. A circuit according to claim 12 wherein said first current mirror means comprises:
a seventh field effect transistor having a source coupled to said first supply voltage terminal, a gate coupled to the gate of said second field effect transistor, and a drain coupled to the gate and the drain of said first field effect transistor;
an eighth field effect transistor having a source coupled to said first supply voltage terminal, and a gate and a drain coupled to the gate of said second field effect transistor;
a ninth field effect transistor having a gate and a source coupled to the drain of said seventh field effect transistor, and a drain coupled to the voltage reference node; and
a tenth field effect transistor having a drain coupled to the gate of said second field effect transistor, a gate coupled to the gate of said ninth field effect transistor, and a source coupled to said gain terminal.

14. A circuit according to claim 13 wherein said second current mirror means comprises:
an eleventh field effect transistor having a gate and a drain coupled to the drain of said third field effect transistor, and a source coupled to said third supply voltage terminal; and
a twelfth field effect transistor having a drain coupled to the voltage reference node, a gate coupled to the gate of said eleventh field effect transistor, and a source coupled to said third supply voltage terminal 15. A circuit according to claim 14 wherein said third current mirror means comprises:
a thirteenth field effect transistor having a gate and a drain coupled to the drain of said fifth field effect transistor, and a source coupled to said third supply voltage terminal; and
a fourteenth field effect transistor having a drain coupled to said output current sink terminal, a gate coupled to the gate of said thirteenth field effect transistor, and a source coupled to said third supply voltage terminal.

16. A circuit comprising:
a first supply voltage terminal;
a second supply voltage terminal;
a third supply voltage terminal;
an output current sink terminal;
an output current source terminal;
a gain terminal;
a first resistor coupled between said first supply voltage terminal and a voltage reference node;
a second resistor coupled between the voltage reference node and said third supply voltage terminal;
a first field effect transistor having a source coupled to said first supply voltage terminal, and having a gate and a drain;
a second field effect transistor having a source coupled to said first supply voltage terminal, a gate coupled to a current reference node, and having a drain;
a third field effect transistor having a source coupled to the drain of said second field effect transistor, a gate coupled to said gain terminal, and having a drain;
a fourth field effect transistor having a source coupled to said first supply voltage terminal, a gate coupled to the current reference node, and having a drain;
a fifth field effect transistor having a source and a gate coupled to the drain of said fourth field effect transistor, and having a drain;
a sixth field effect transistor having a source coupled to said first supply voltage terminal, a gate coupled to the current reference node, and a drain coupled to said output current source terminal;
a seventh field effect transistor having a source coupled to said first supply voltage terminal, a gate coupled to the current reference node, and a drain coupled to the gate and the drain of said first field effect transistor;
an eighth field effect transistor having a source coupled to said first supply voltage terminal, and a gate and a drain coupled to the current reference node;
a ninth field effect transistor having a source and a gate coupled to the drain of said seventh field effect transistor, and a drain coupled to the voltage reference node;
a tenth field effect transistor having a drain coupled to the current reference node, a gate coupled to the gate of said ninth field effect transistor, and a source coupled to said gain terminal;
a gain resistor coupled between said gain terminal and said second supply voltage terminal;
an eleventh field effect transistor having a gate and a drain coupled to the drain of said third field effect transistor, and a source coupled to said third supply voltage terminal;
a twelfth field effect transistor having a drain coupled to the voltage reference node, a gate coupled to the gate of said eleventh field effect transistor, and a source coupled to said third supply voltage terminal;
a thirteenth field effect transistor having a gate and a drain coupled to the drain of said fifth field effect transistor, and a source coupled to said third supply voltage terminal; and
a fourteenth field effect transistor having a drain coupled to said output current sink terminal, a gate coupled to the gate of said thirteenth field effect transistor, and a source coupled to said third supply voltage terminal.

* * * * *

UNITED STATES PATENT AND TRADEMARK OFFICE
CERTIFICATE OF CORRECTION

PATENT NO. : 4,835,487

DATED : May 30, 1989

INVENTOR(S) : James T. Doyle et al

It is certified that error appears in the above-identified patent and that said Letters Patent is hereby corrected as shown below:

Column 7, claim 1, line 2, delete "voltage", and insert therefor --voltages--.

Signed and Sealed this

Twenty-seventh Day of March, 1990

Attest:

JEFFREY M. SAMUELS

*Attesting Officer*　　　*Acting Commissioner of Patents and Trademarks*